(12) United States Patent
Brugger et al.

(10) Patent No.: US 6,313,905 B1
(45) Date of Patent: Nov. 6, 2001

(54) APPARATUS AND METHOD FOR DEFINING A PATTERN ON A SUBSTRATE

(75) Inventors: Juergen P. Brugger, Enschede (NL); James K. Gimzewski, Rueschlikon (CH); Pierre L. Guéret, Thalwil (CH); Roland Luethi-Oetterli, Riehen (CH); Räto R. Schlittler, Schoenenberg (CH); Mark E. Welland, Trumpington (GB)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/407,725

(22) Filed: Sep. 28, 1999

(30) Foreign Application Priority Data

Sep. 28, 1998 (EP) .................................................. 98118283

(51) Int. Cl.⁷ ........................... G03B 27/52; G03B 27/42; G03B 27/54; G01B 11/00; G03F 9/00
(52) U.S. Cl. ................................. 355/55; 355/53; 355/67; 356/399; 356/400; 356/401; 430/5; 430/20; 430/22; 430/30
(58) Field of Search ................................. 355/53, 55, 67; 356/399, 40, 401; 430/5, 20, 22, 30

(56) References Cited

U.S. PATENT DOCUMENTS

| | | | |
|---|---|---|---|
| 4,020,493 | * | 4/1977 | Palac et al. ........................ 354/1 |
| 5,204,711 | * | 4/1993 | Takubo et al. ........................ 355/53 |
| 5,362,575 | * | 11/1994 | Trimble ................................ 428/688 |
| 5,656,399 | * | 8/1997 | Abate et al. ........................... 430/5 |
| 5,666,189 | * | 9/1997 | Rostoker et al. ..................... 355/53 |
| 5,876,880 | * | 3/1999 | Vonach et al. ......................... 430/5 |
| 5,908,719 | * | 6/1999 | Guckel et al. ......................... 430/5 |
| 5,935,739 | * | 8/1999 | Bayer et al. ........................... 430/5 |
| 6,004,700 | * | 12/1999 | Greschner et al. .................... 430/5 |

\* cited by examiner

*Primary Examiner*—Russell Adams
*Assistant Examiner*—Khaled Brown
(74) *Attorney, Agent, or Firm*—Scully, Scott, Murphy & Presser; Daniel P. Morris, Esq.

(57) ABSTRACT

The invention provides an apparatus and a method for defining a pattern on a substrate using a shadow masking technique. Said apparatus comprises a flexible member having a movable portion and at least one aperture. The flexible member is positioned in operation above the substrate thereby acting as a shadow mask. The apparatus further comprises a support for the substrate, distance-controlling means for controlling the distance between said movable portion and said substrate, and an actuator for moving the flexible member and substrate relative to each other parallel to a surface of the substrate. The apparatus further comprises an emission source which emits materials, electrons or light and which aims through the shadow mask at the substrate where the pattern is defined. Such a pattern might be employed in micromechanic, microoptic or microelectronic devices, for example. The described apparatus may be implemented using the AFM principal.

29 Claims, 2 Drawing Sheets

APPARATUS AND METHOD FOR DEFINING A PATTERN ON A SUBSTRATE

BACKGROUND OF THE INVENTION

1. Technical Field

The present invention is related to an apparatus and method for defining a pattern on a substrate using a shadow masking technique.

2. Prior Art

The shadow masking technique as well as inclined exposure and deposition are well known and allow efficient fabrication of patterns by replacing the conventional lithography cycle comprising deposition, photo and etch process steps by just one single process and machine. A main disadvantage of the traditional shadow masking technique is its limitation to simple low density patterns. Up to now it has not been possible to define more complex patterns, such as ring type patterns, or to produce patterns in close proximity to each other with sub 100 nm dimensions by shadow masking technique. Inclined exposure and deposition allows definition of very small single features, but the close proximity of patterns cannot be achieved by inclination.

V.T. Petrashov, Microelectronic Engineering 35 (1997) p. 357–359 reflects the state of the art. The technique proposed there allows fabrication of more complex patterns and elements with dimensions of less than 50 nm. This is achieved by a lift-off technique using self narrowing of atomic beams and in-situ rotation of the substrate. The lift-off technique is a special form of photo lithography and therefore different from the shadow masking technique. It has not the simplicity of the shadow masking technique because it includes a photo step as well as final removal of photo resist and excess material (the so-called lift-off).

It is an object of the present invention to overcome the disadvantages of prior art systems and to define patterns of complex shape in close proximity to each other with sub 100 nm dimensions.

SUMMARY OF THE INVENTION

The present invention is directed to an apparatus which comprises a flexible member having a mounting base, a movable portion which is movable with respect to said mounting base and at least one aperture in or near said movable portion, said member in operation being positioned above said substrate thereby acting as a shadow mask. The apparatus further comprises an emission source aiming through said aperture at said substrate, distance-controlling means for controlling the distance between said movable portion and said substrate and an actuator for moving said flexible member and said substrate relative to each other parallel to a surface of the substrate.

A unique feature of the described apparatus is that rings and other complex types of patterns can be defined by shadow masking technique. Another unique feature of the invention in comparison with standard shadow masking techniques is that high pattern densities with a spacing of less then 100 nm can be achieved. The ability to move the shadow mask together with the precise positioning relative to previously fabricated patterns allows a high pattern density on the substrate. On the shadow mask, the spacing of the apertures can be much larger. In principle, a shadow mask with one single aperture (e.g. a circular hole) is sufficient to define an arbitrary pattern on the substrate and to repeat it as often as necessary.

Various modifications and improvements of said apparatus are also disclosed. Using the Atomic Force Microscopy (AFM) principle for implementing the described apparatus has additional advantages. The AFM is very powerful at distance regulation on the sub nm scale and at identifying nano-scale features. The current invention concerns a special form of such a device where the cantilever contains one or more apertures and serves as a shadow mask. In the current invention the force interaction between a cantilever with integrated tip, and a surface of a substrate can be used to maintain the cantilever (i.e. the shadow mask) at a constant height with respect to the substrate, to allow precise positioning of the shadow mask in the surface plane relative to previously fabricated or existing patterns, and to validate the defined patterns during/after fabrication. It is important to mention that the cantilever need not resemble a conventional AFM cantilever but could be a larger flexible member. The shadow mask can be moved during patterning and thereby arbitrary patterns can be defined. A plurality of shadow masks may be operated independently or in parallel.

Using a tip integrated in the flexible member proves advantageous because the tip will be able to follow a surface of a substrate very closely when scanning the surface. For certain applications the tip may also be rounded or replaced by a bump or a larger element. A conductive tip may be used for in-situ inspection of electrical properties or in-situ functional testing. It is also possible to have more than one tip on a flexible member. The tip may be used:

as scanning part in the distance-controlling means thus allowing to position the shadow mask in close and at a well defined distance to a surface of a substrate.

for pattern inspection whereby the position of the tip with respect to a pattern can be defined to within 1nm. The position of an aperture relative to the tip can also be defined within 1 nm. The presence of the aperture on the same movable component (the flexible member) as the tip ensures a precise auto-alignment. The true position of a flexible member could be controlled using optical feedback. This allows e.g. in-situ quality monitoring, identification of existing patterns and subsequent relative positioning of an aperture and the corresponding pattern with nanometer accuracy, and copying and cloning of existing patterns by scanning a master pattern.

for local surface modification on a substrate. This is especially advantageous in repair work where e.g. in-situ interruption of a metal line may be needed.

for inspection of electrical properties. In this case, conductive tips such as diamond tips can be used. In-situ inspection of electric properties allows to define electrical resistance, capacitance, transconductance etc. of devices as they are made, thereby tightening the specification of nanometer electronics. This is particularly a crucial issue in the fabrication of single-electron transistors.

for in-situ functional testing of devices. The test results can be used as input for process control, for yield improvement, for repair or in case of larger devices for activating redundant elements.

The in-situ monitoring of a physical or chemical property can be used to advantage for interactive process control. It is e.g. possible to program the tip to inspect the thickness of a generated pattern and to feed back this information in order to modify the deposition rate or time, or the scan speed at which the aperture is moving.

Locating an aperture in or near a tip proves advantageous because the distance to the surface of a substrate is most accurate at the tip.

Inclined exposure or deposition, where the direction of the emission source, and/or the walls of the apertures in the mask are inclined, can be combined to advantage with an apparatus according to the present invention. Spots and lines thus produced will be smaller and the dimensions of the mask features (i.e. of the apertures in the flexible member) can be much larger than the patterns achieved.

In accordance with the present invention, the emission source can be an electron, light or material source. When an electron source is used, a new form of lithography is possible. The apparatus of the present invention is also compatible with high-resolution e-beam lithography. The creation of a master mask using conventional e-beam lithography compensates for the slow write speed of this technique. In the described apparatus, copies of the master can quickly be generated using a large beam electron source. This removes the need for highly focused expensive electron optics.

When a material source is used, the material deposition in and around an aperture will cause narrowing of the aperture (hole-filling). The hole-filling effect can be used to advantage in enabling single-atom wires to be written. In most cases however it will be necessary to control or reduce the amount of material deposited at an aperture by material-deposition-reducing means. This can be done for example by:
- introducing a sputtering ion beam at an oblique angle to maintain a clean aperture and to eliminate the hole-filling effect,
- monitoring the resonant frequency of the flexible member. Thus the local deposition rate on the flexible member can be monitored and used to control the cleaning process.
- chemical treatment in order to create phobic aperture walls. A thin coating of polymerized fluorocarbon molecules would e.g. ensure that the deposited atoms do not nucleate on the aperture walls.

In a modification of the described apparatus, the flexible member can also be equipped with local emission sources such as, field emitters for electrons and ions, light emitters e.g. tiny laser diodes, cold or hot liquid metal or field desorption sources, etc.

In another modification of the described apparatus, a shutter is used. The shutter could be any device suitable for shutting off the emission of a source towards a substrate partly or completely. The shutter could be e.g. a movable mask or a second flexible member in close proximity to the first one and could be operated by a piezoelectric, magnetic or electrostatic activator. Multiple shutters may be employed in the same apparatus. A shutter allows:
- to shut off emission without switching off the emission source,
- to decrease the minimum feature size by closing a shutter partially with respect to the shadow mask or to another shutter,
- in conjunction with different material sources, to fabricate multilayered sub 100 nm devices. The economic aspect of this approach is that the traditional deposition-pattern-etch cycle, each with its many substeps is reduced to one single process and machine.

In another embodiment, the described apparatus may comprise shading means for shading those regions of a substrate which are not covered by a flexible member.

The described apparatus may comprise a series of apertures on a single flexible member and/or several flexible members, thus enlarging the capability and throughput of the apparatus. The flexible members may be arranged in one or two-dimensional arrays. Vertical stacking is also possible. The additional members in a stack could be used as shutters. The flexible members may be equipped with independent distance regulation and individual tips and could be operated by a scanner. In this way it is possible to simultaneously define a considerable number of identically spaced and aligned patterns. By using a computer to control the coordinates of the aperture, the intensity of the emission source, the writing speed, and the material selection, designs for novel devices can be built to order in a massively parallel manner.

When the described apparatus is implemented by e.g. using an AFM module, the entire AFM module with the substrate can be transported through a number of connecting chambers or to another location without losing alignment. At each stage it would be electrically connected and put into operation.

In this way other processes such as Ion Etching or Ion Implantation could be conducted without disturbing the alignment. A series of such AFM modules could be set up in a production line comprising different process chambers such that each process chamber is in constant use. This is especially economic since the AFM modules are relatively cheap.

BRIEF DESCRIPTION OF THE DRAWINGS

Preferred embodiments of the present invention will now be described, by way of example only, with reference to the accompanying drawings in which.

DETAILED DESCRIPTION OF THE PREFERRED EMBODIMENTS OF THE INVENTION

Figures 1A, 1B:
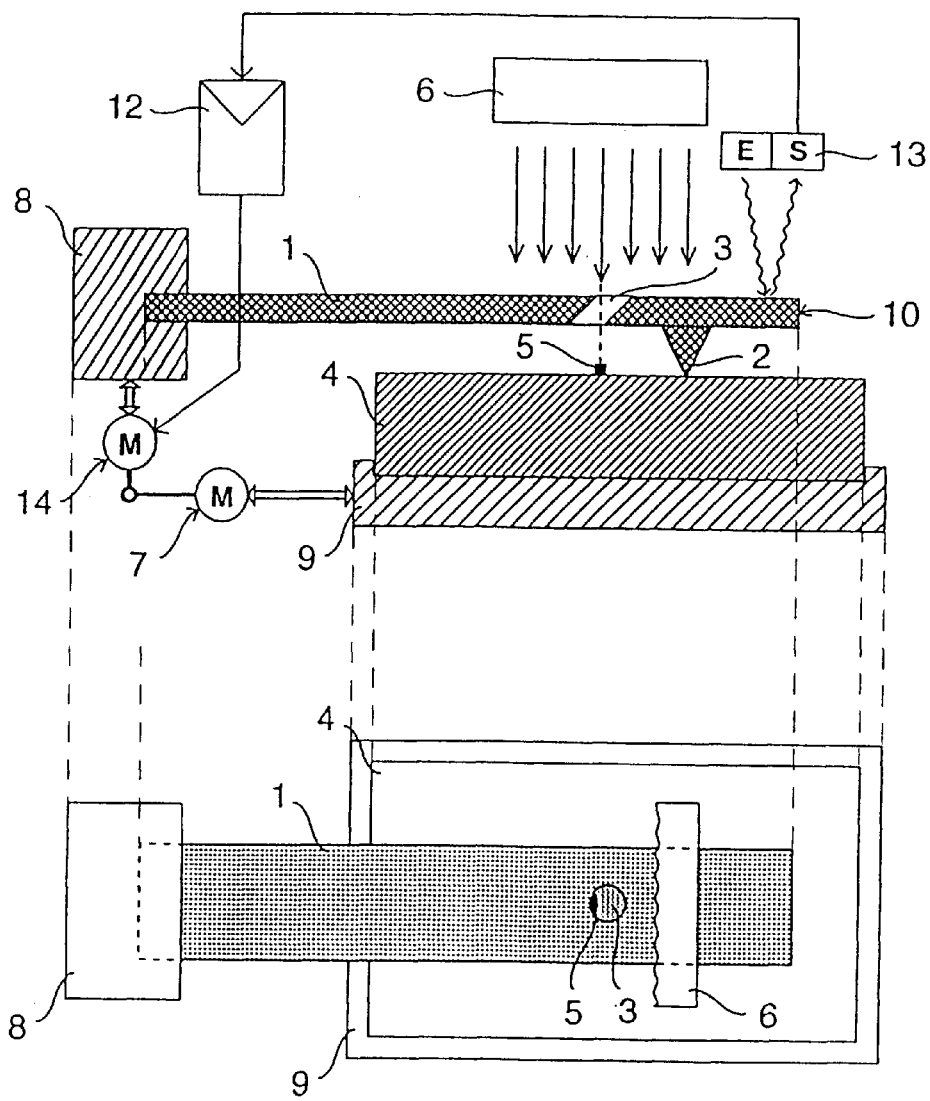
FIGS 1a & 1b show the cross section and a top view of an embodiment of the present invention.

In the present disclosure the following definitions apply:

A SUBSTRATE is the underlying basis where patterns and devices are built on or in. Examples: Semiconductors such as polished silicon slices, glass plates, plastics, organic materials, photoresists, etc.

A PATTERN is any local modification of given shape on or in a substrate. Examples: Metal wires deposited on the substrate, local change of a chemical or physical property like color, reflectivity, electric charge, excitation state or magnetization, exposed area in a photoresist, local implant of a different material, etc.

A FLEXIBLE MEMBER is a mechanical part having a movable portion which deflects under load and relaxes when no load is applied or vice versa. Flexible members can be made e.g. from inexpensive Si or SiNx. Examples: Cantilever (e.g. an atomic force microscope cantilever), larger paddle like structure used in the same way, beam or bridge supported at both ends, membrane supported in a way that it exhibits flexible behaviour, etc.

AN APERTURE is a hole which allows material, ions, electrons or light to pass through. Such holes can be created using optical or e-beam lithography and standard micromechanical fabrication techniques for etching, such as isotropic wet etching. Anisotropic Ion Etching may be used to produce vertical and inclined aperture walls. New forms of lithography, such as microcontact processing, may also be employed. Apertures can also be readily produced using Focused Ion Beam (FIB) technology. Examples: Circular hole, slit with inclined walls, etc.

AN EMISSION SOURCE is any source which emits electromagnetic radiation, elementary particles or materials. Certain emission sources such as semiconductor lasers might be placed right on the flexible member. Examples: Conventional light source, optical system comprising a light source and one or more glass fibers, Scanning Near-field Optical Microscope (SNOM) source, electron source, ion source, evaporation source, etc.

DISTANCE-CONTROLLING MEANS controls the distance between the movable portion of the flexible member (i.e. the shadow mask) and a sur-face of the substrate or a portion thereof. The distance-controlling means might be attached to a flexible member, or it might be an integral part of the flexible member, which scans the surface of the substrate. The distance- controlling means might further comprise a sensor, such as an optical or capacitive sensor, for detecting any deflection of the flexible member, a controller, and a motor or actuator to adjust the distance. Example: Atomic force microscope or scanning tunneling microscope whereby a cantilever with an integrated tip is scanning across a surface such that the distance of the cantilever is maintained constant with respect to the surface or a portion thereof.

ACTUATOR MEANS moves the flexible member (i.e. the shadow mask) and/or the substrate relative to each other parallel to a surface of the substrate.

EXAMPLES

Piezoelectric, Magnetic, or Electrostatic Actuators, etc.

In SHADOW MASKING systems, a mask is used which contains apertures to define a pattern on a substrate. Material, electrons, or light from an emission source passes through the apertures and a pattern is transferred to the substrate as defined by the shape and the arrangement of the apertures. In addition, the apparatus described in the present disclosure allows to define a pattern by moving the shadow mask parallel to a surface of the substrate. When the mask is maintained in close proximity to the surface of the substrate (mm distances) and the emission source is mounted far away (cm distances), the beam passing through the aperture can be considered to be parallel. This provides a faithful reproduction of the shape and arrangement of the apertures on the substrate.

Advanced forms of the shadow masking technique make use of INCLINED EXPOSURE OR DEPOSITION where the direction of the emission source and/or the walls of the apertures in the mask, are inclined, e.g. by 30 degrees. In the apparatus described in the present disclosure, inclined aperture walls can also be achieved by bending the flexible member. The resulting pattern on the substrate is the geometric projection of the apertures on the surface of the substrate. In such a manner patterns with linewidths of less than 10 nm and with a length of 10–100 nm can be achieved.

Scanning probe systems such as ATOMIC FORCE MICROSCOPY (AFM) or SCANNING TUNNELING MICROSCOPY (STM) systems in non-contact and also in contact mode make use of a cantilever with integrated tip which is scanning across a surface of a substrate such that the distance of the cantilever is maintained constant with respect to the surface or a portion thereof. The system may be programmed in such a way that the cantilever follows an arbitrary path on the surface of the substrate, thereby scanning the local surface structure and enabling the system to locate micro and nano-scale features such as microelectronic features.

The first embodiment of the invention is an apparatus which comprises an AFM module placed in an evaporation chamber and aligned under an evaporation source 6. In the present case the distance between the AFM module and the evaporation source 6 might be between 20 and 30 cm. The cross section and top view of the flexible member 1 used in the AFM module is shown in FIGS. 1a and 1b. It has a movable portion 10 with an integrated tip 2, a mounting base 8, and an inclined aperture 3. The flexible member 1, apart from the aperture 3, corresponds to the standard cantilever design used in AFM. The inclined aperture 3 can e.g. be created using Focused Ion Beam (FIB) technology, or e-beam lithography and anisotropic ion etching. Before starting deposition, a substrate 4, e.g. a silicon slice, is placed on a substrate holder 9 of the AFM module. During deposition the flexible member 1 acts as a shadow mask. The distance to the surface of the substrate 4 is controlled by distance-controlling means, herein represented by a control loop comprising the flexible member 1 with tip 2 as a scanning device, an optical sensor 13 comprising an emitter and a sensor, a controller 12, and a motor 14 which adjusts the height of the flexible member 1. The control loop keeps the deflection of the movable portion 10 of the flexible member 1 (i.e. the distance of the shadow mask to the surface of the substrate) constant. In the present embodiment the control loop is part of the AFM module. The distance between the flexible member 1 and substrate 4 is in the order of 10 nm up to 10 mm, and typically about 1 mm. During evaporation the source 6 aims through the aperture 3 at the substrate 4 thus producing a pattern 5. Using computer control of an actuator 7 allows to deposit dots as well as lines of more complex shape. In such a manner line widths of metal on silicon of less than 10 nm with a length of 10 to 100 nm can be achieved.

Figure 2:
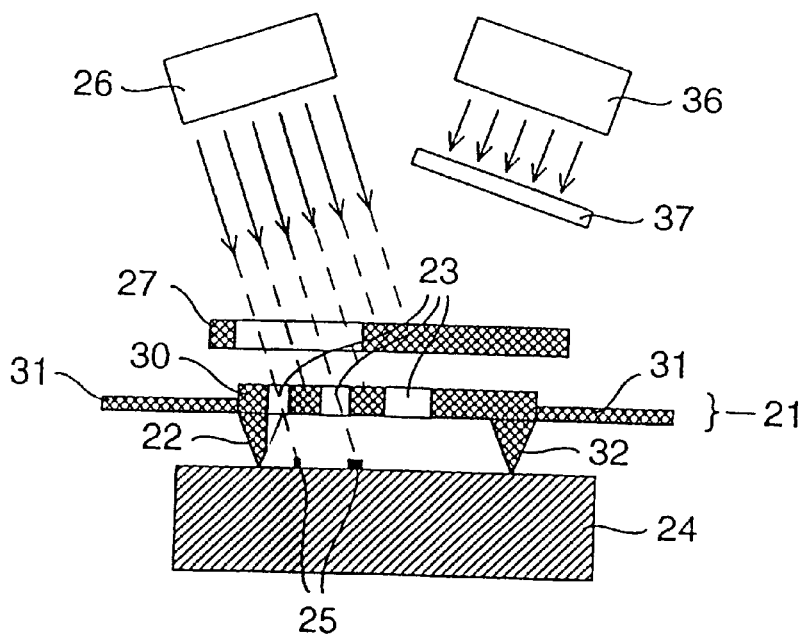
FIG. 2 shows the cross section of a second embodiment where the flexible member comprises a membrane-like microstage with several apertures.

In the second embodiment shown in FIG. 2, the apparatus also comprises an AFM module placed in a deposition chamber. In this embodiment the deposition chamber is equipped with two material sources 26, 36 mounted in such a way that the direction to a surface of a substrate 24 is inclined by e.g. 30 degrees. The flexible member 21 used in the AFM module comprises a membrane-like microstage 30 suspended by narrow beams 31 which give the microstage 30 a flexible behaviour. The microstage 30 corresponds to the movable portion 10 of the member 1 in FIGS. 1a and 1b. It has two integrated tips 22, 32 and a third one not shown in the cross section of FIG. 2, to keep it parallel with a surface of the substrate 24. The microstage 30 contains a series of apertures 23 with vertical walls and acts during deposition as a shadow mask. The distance of the shadow mask (i.e. of the microstage 30) to the surface of the substrate 24 is controlled by a control loop which might be similar to the one described in the first embodiment. The shadow mask is moved parallel to the surface of the substrate 24 by computer-controlled comb actuators. The apparatus further comprises two shutters 27, 37. The shutter 27 is used to open and close a selection of the apertures 23 thereby enabling different patterns to be defined on the substrate 24. The shutter 37 is used to shut off the emission of the material source 36. The emission of the material source 26 is controlled by switching the source on and off. During deposition the material source 26 aims through the overlapping apertures in the shutter 27 and the microstage 30 at the substrate 24 thus producing the patterns 25. In such a manner, different patterns made of two different materials can be produced.

The apparatus and the method according to the present invention allow parallel deposition of metal wires, MBE multilayers, a-Si and other related materials in the sub 100 nm region, localized etching procedures, multiple processing of nanostructures, complete fabrication of micromechanical, microoptical and microelectronic devices obviating the need for the usual photo lithography cycle, complete device fabrication in one machine with in-situ monitoring, electrical and optical characterization, verification of device operation and repair possibility, fabrication in small dimensions with feature sizes of less than 10 nm, fabrication on non-planar structures, fast fabrication of arbitrary designs such as prototypes.

Typical applications include data storage by nm-sized structures such as magnetic storage elements using quantum bits, high resolution TFT and other flat panel displays, fabrication of logic and memory devices, mask or circuit inspection and repair (for standard technology), e.g. completing a broken line, microelectronic, optoelectronic or magnetooptic devices where light passing through a movable and precisely positionable aperture is used to investigate, test or operate the devices. The light source may also be placed on the flexible member. In certain applications an electron source may be used instead of a light source.

additional lithographic steps using an electron or light source aiming through a movable and precisely positionable aperture. The emission source may also be placed on the flexible member.

While the invention has been particularly shown and described with respect to preferred embodiments thereof, it will be understood by those skilled in the art that the foregoing and other changes in from and details may be made therein without departing form the spirit and scope of the invention.

Having thus described our invention; what we claim as new, and desire to secure by letters patent is:

1. An apparatus for defining a pattern on a substrate, said apparatus comprising
   a flexible member having a mounting base, a movable portion which is movable with respect to said mounting base, and defining at least one aperture which is positionable above said substrate,
   an emission source for directing an emission through said aperture and at said substrate,
   distance-controlling means for controlling the distance between said movable portion of the flexible member and said substrate,
   actuator means for moving said flexible member and said substrate relative to each other parallel to a surface of said substrate.

2. The apparatus according to claim 1, wherein the distance between the flexible member and the substrate is controllable using atomic force microscopy (AFM) principle.

3. The apparatus according to claim 1, wherein the distance-controlling means comprises at least one tip attached to the flexible member to engage the substrate.

4. The apparatus according to claim 3, wherein the tip is adapted for pattern inspection on a substrate.

5. The apparatus according to claim 3, wherein the tip is conductive and is adapted for inspection.

6. The apparatus according to claim 5, wherein the tip is adapted for functional testing.

7. The apparatus according to claim 1, further including a monitoring means to monitor a property of a pattern.

8. The apparatus according to claim 7, further including emission control means for using the monitored property for controlling the effect of the emission on the surface of the substrate.

9. The apparatus according to claim 3, wherein the aperture is in one of the at least one tip.

10. The apparatus according to claim 1, wherein the aperture has been fabricated using Focused Ion Beam (FIB) technology.

11. The apparatus according to claim 1, wherein at least one side of the aperture is inclined to a surface of the flexible member.

12. The apparatus according to claim 1, wherein the direction of the emission from the emission source is inclined.

13. The apparatus according to claim 1, wherein the emission source is selected from the group comprising an electron source, a light source, and a material source.

14. The apparatus according to claim 13, wherein the emission source comprises a material source, said apparatus comprises material-deposition-reducing means for reducing the amount of material deposited on the flexible member.

15. The apparatus according to claim 1, wherein the emission source is arranged at the flexible member.

16. The apparatus according to claim 1, wherein at least one shutter is arranged for at least partially covering the aperture.

17. The apparatus according to claim 16, wherein the shutter is selected from the group comprising a movable mask, and a second flexible member with at least one aperture.

18. The apparatus according to claim 16, wherein the shutter is movable by shutter-actuating means.

19. The apparatus according to claim 1, comprising shading means for shading a region on the substrate from the emission source.

20. The apparatus according to claim 1, comprising several of the flexible members.

21. The apparatus according to claim 1, comprising multiple of the emission sources.

22. A method for defining a pattern on a substrate comprising:
   positioning a flexible member above said substrate, said flexible member having a mounting base, a movable portion which is movable with respect to said mounting base, and defining at least one aperture;
   emitting emissions from a emission source through said aperture and towards said substrate; and
   controlling the distance between said movable portion of the flexible member and said substrate.

23. The method according to claim 22, wherein the flexible member and the substrate are moved relative to each other parallel to a surface of said substrate.

24. The method according to claim 22, wherein the distance between the flexible member and the substrate is controlled by atomic force microscopy (AFM) principle.

25. The method according to claim 22, wherein the distance between the flexible member and the substrate is controlled by the aid of at least one tip attached to the flexible member.

26. The method according to claim 25, wherein a pattern is inspected using a tip.

27. The method according to claim 22, wherein a property is monitored, and the effect of the emission on the surface of the substrate is controlled by the monitored property.

28. The method according to claim 22, wherein the amount of material deposited on the flexible member is controlled.

29. The method according to claim 22, wherein the aperture is at least partially covered using a shutter, and said shutter is moved by shutter-actuating means.

* * * * *